(12) United States Patent
Dao et al.

(10) Patent No.: US 8,362,814 B2
(45) Date of Patent: Jan. 29, 2013

(54) DATA PROCESSING SYSTEM HAVING BROWN-OUT DETECTION CIRCUIT

(75) Inventors: Chris C. Dao, Pflugerville, TX (US); Stefano Pietri, Austin, TX (US); Andre Luis Vilas Boas, Campinas (BR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/553,095

(22) Filed: Jul. 19, 2012

(65) Prior Publication Data

US 2012/0281491 A1 Nov. 8, 2012

Related U.S. Application Data

(62) Division of application No. 12/694,023, filed on Jan. 26, 2010, now Pat. No. 8,228,100.

(51) Int. Cl.
*H03L 7/00* (2006.01)

(52) U.S. Cl. .......................... 327/143; 327/198

(58) Field of Classification Search .............. 327/65, 327/77, 142, 143, 198
See application file for complete search history.

(56) References Cited

U.S. PATENT DOCUMENTS

| | | | |
|---|---|---|---|
| 4,703,191 A | 10/1987 | Ferguson | |
| 5,564,010 A | 10/1996 | Henry et al. | |
| 5,606,511 A | 2/1997 | Yach | |
| 5,943,635 A | 8/1999 | Inn | |
| 6,246,626 B1 | 6/2001 | Roohparvar | |
| 6,366,521 B1 | 4/2002 | Roohparvar | |
| 6,420,909 B1 | 7/2002 | Barnes | |
| 6,894,544 B2 * | 5/2005 | Gubbins | 327/143 |
| 7,030,668 B1 | 4/2006 | Edwards | |
| 7,259,597 B2 | 8/2007 | Wu | |
| 7,482,847 B2 | 1/2009 | Suzuki | |
| 7,495,875 B2 | 2/2009 | Lin | |
| 7,525,353 B2 | 4/2009 | Wadhwa et al. | |
| 7,570,084 B2 | 8/2009 | Komiya | |
| 7,693,669 B2 | 4/2010 | Saether | |
| 7,852,130 B2 | 12/2010 | Nakano | |
| 8,228,100 B2 * | 7/2012 | Dao et al. | 327/143 |
| 8,253,453 B2 * | 8/2012 | Vilas Boas et al. | 327/143 |
| 2003/0227306 A1 | 12/2003 | Di Iorio | |
| 2004/0239413 A1 | 12/2004 | Gubbins | |
| 2007/0001721 A1 | 1/2007 | Chen et al. | |
| 2007/0104013 A1 | 5/2007 | Lee | |
| 2009/0206873 A1 | 8/2009 | Choi | |

FOREIGN PATENT DOCUMENTS

| | | |
|---|---|---|
| KR | 10-0656432 B1 | 12/2006 |
| KR | 10-2009-0090000 A | 8/2009 |

OTHER PUBLICATIONS

International Application PCT/US2011/021709, PCT Search Report and Written Opinion dated Sep. 14, 2011.

* cited by examiner

*Primary Examiner* — Hai L Nguyen
(74) *Attorney, Agent, or Firm* — Sherry W. Schumm; Daniel D. Hill

(57) ABSTRACT

A data processing system includes a brown-out detection circuit with a first resistive element, a first transistor, a second transistor, and a comparator. The first resistive element has a first terminal coupled to a first power supply voltage terminal, and a second terminal. The first transistor has a first current electrode coupled to the second terminal of the first resistive element, a control electrode, and a second current electrode. The second transistor has a first current electrode coupled to the second current electrode of the first transistor, a control electrode, and a second current electrode coupled to a second power supply voltage terminal. The comparator has a first input terminal coupled to the first terminal of the first resistive element, a second input terminal coupled to the second terminal of the first resistive element, and an output terminal for providing a brown-out detection signal.

11 Claims, 2 Drawing Sheets

DATA PROCESSING SYSTEM HAVING BROWN-OUT DETECTION CIRCUIT

RELATED APPLICATION

This application is a divisional of co-pending, U.S. patent application Ser. No. 12/694,023, filed on Jan. 26, 2010.

BACKGROUND

1. Field

This disclosure relates generally to electrical circuits, and more specifically, to a data processing system having a brown out detection circuit.

2. Related Art

Some data processing systems include a low power, or stand-by, mode where power is removed from most of the system during certain times to reduce power consumption. It is often desirable to maintain a power supply voltage to a small portion of the system, such as for example, a static random access memory (SRAM), to retain certain critical memory contents. However, an SRAM requires a specified minimum data retention voltage to prevent data loss. The power supply voltage provided to the SRAM during low power mode may become too low for reliable data retention. Also, a drop in the power supply voltage can occur anytime and can be due to a variety of reasons. When the supply voltage to the system SRAM falls below the minimum data retention voltage, it is important to inform the system of possible corrupted data.

A brown-out detector is used to monitor the power supply voltage and provide a warning when the monitored voltage falls below a predetermined voltage. The system can then take corrective action. Current brown out detectors are relatively inaccurate, so a relatively high voltage is required to guarantee correct system operation. As improving process technologies allow for the use of progressively lower power supply voltages, the accuracy of the brown-out detector becomes more important.

Therefore, what is needed is a brown-out detector that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
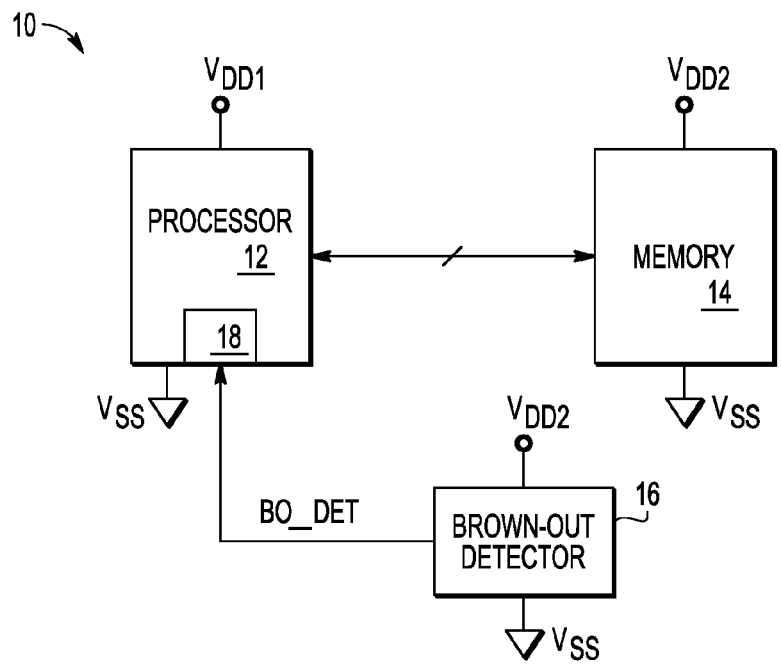
FIG. 1 illustrates, in block diagram form, a data processing system in accordance with an embodiment.

Generally, there is provided, a brown-out detection circuit for use in a data processing system having a memory such as an SRAM. The brown-out detection circuit includes a reference circuit, a resistive element, and a comparator. The reference circuit includes a P-channel transistor having one or more characteristics that are similar to those of a P-channel transistor used in an SRAM cell. The reference circuit also includes an N-channel transistor having one or more characteristics that are similar to those of an N-channel transistor used in the SRAM cell. The one or more characteristics may include a threshold voltage ($V_T$) of the P-channel and N-channel transistors. In the reference circuit, the P-channel transistor and the N-channel transistor are connected in series with the resistive element. The comparator includes input terminals coupled across the resistive element, and an output terminal for providing a brown-out detection signal. The comparator may include a built-in offset. When a power supply voltage drops below a predetermined voltage level, one or both of the N-channel transistor and the P-channel transistor will become substantially non-conductive, causing the comparator to detect a change in voltage across the resistive element, and to provide the brown-out detection signal to inform the data processing system that the power supply voltage has dropped to a level that may cause data stored in the SRAM cell to become corrupted.

By including a reference circuit that models one or more characteristics of transistors of the SRAM cell, the brown-out detection circuit can detect a low voltage condition more accurately, thus requiring a reduced voltage margin for correct system operation.

In one aspect, there is provided, a brown-out detection circuit comprising: a first resistive element having a first terminal coupled to a first power supply voltage terminal, and a second terminal; a first transistor of a first conductivity type having a first current electrode coupled to the second terminal of the first resistive element, a control electrode, and a second current electrode; a second transistor of a second conductivity type having a first current electrode coupled to the second current electrode of the first transistor, a control electrode, and a second current electrode coupled to a second power supply voltage terminal; and a comparator having a first input terminal coupled to the first terminal of the first resistive element, a second input terminal coupled to the second terminal of the first resistive element, and an output terminal for providing a brown-out detection signal. The brown-out detection circuit may be part of a data processing system comprising a static random access memory (SRAM) cell, and the first transistor may model a first threshold voltage of a transistor of the SRAM cell having the first conductivity type, and the second transistor may model a second threshold voltage of a transistor of the SRAM cell having the second conductivity type. The brown-out detection circuit may further comprise a second resistive element coupled between the first and second transistors. The brown-out detection circuit may further comprise: a driver circuit having an input terminal coupled to the output terminal of the comparator, and an output terminal; and a latch having an input terminal coupled to the output terminal of the driver circuit, and an output terminal. The brown-out detection circuit may further comprise a second resistive element coupled between the second current electrode of the second transistor and the second power supply voltage terminal. The comparator may comprise: a third transistor having a first current electrode coupled to the first power supply voltage terminal, and a control electrode and a second current electrode both coupled together; a fourth transistor having a first current electrode coupled to both the control electrode and the second current electrode of the third transistor, a control electrode coupled to the first terminal of the first resistive element, and a second current electrode; a fifth transistor having a first current electrode coupled to the first power supply voltage terminal, a control electrode coupled to the control electrode and second current electrode of the third transistor, and a second current electrode; and a sixth transistor having a first current electrode coupled to the second current electrode of the fifth transistor, a control electrode coupled to the second terminal of the first resistive element, and a second current electrode coupled to the second current electrode of the fourth transistor. The control electrode of the fourth transistor may have a different width/length ratio than a width/length ratio of the control electrode of the sixth transistor. The brown-out detection circuit may be used for monitoring a power supply voltage provided to a static random access memory (SRAM) having a plurality of memory cells, wherein the first transistor is a P-channel transistor and the second transistor is an N-channel transistor, wherein the first transistor models a first threshold voltage of a P-channel transistor of one of the plurality of memory cells, and wherein the second transistor models a second threshold voltage of an N-channel transistor of one of the plurality of memory cells. The first resistive element may be characterized as being a polysilicon resistor.

In another aspect, there is provided, a data processing system comprising: a processor; a memory coupled to the processor, the memory comprising a plurality of memory cells, each of the plurality of memory cells coupled to a first power supply voltage terminal and a second power supply voltage terminal, each memory cell having a pull-up transistor and a pull-down transistor coupled to a data storage node; and a brown-out detection circuit comprising: a first resistive element having a first terminal coupled to the first power supply voltage terminal, and a second terminal; a P-channel transistor having a source coupled to the second terminal of the first resistive element, a gate coupled to the second power supply voltage terminal, and a drain, wherein the P-channel transistor is for modeling a characteristic of the pull-up transistor of a memory cell of the memory; an N-channel transistor having a drain coupled to the drain of the P-channel transistor, a gate coupled to the first power supply voltage terminal, and a source coupled to the second power supply voltage terminal, wherein the N-channel transistor is for modeling a characteristic of a pull-down transistor of the memory cell; and a comparator having a first input terminal coupled to the first terminal of the first resistive element, a second input terminal coupled to the second terminal of the first resistive element, and an output terminal for providing a brown-out detection signal in response to detecting that a power supply voltage provided to the first and second power supply voltage terminals is below a predetermined voltage. The brown-out detection circuit may further comprise a second resistive element coupled between the P-channel transistor and the N-channel transistor. The brown-out detection circuit may further comprise a second resistive element coupled between the source of the N-channel transistor and the second power supply voltage terminal. The comparator may comprise: a first transistor having a first current electrode coupled to the first power supply voltage terminal, and a control electrode and a second current electrode both coupled together; a second transistor having a first current electrode coupled to both the control electrode and the second current electrode of the first transistor, a control electrode coupled to the first terminal of the first resistive element, and a second current electrode; a third transistor having a first current electrode coupled to the first power supply voltage terminal, a control electrode coupled to the control electrode and second current electrode of the first transistor, and a second current electrode; and a fourth transistor having a first current electrode coupled to the second current electrode of the third transistor, a control electrode coupled to the second terminal of the first resistive element, and a second current electrode coupled to the second current electrode of the second transistor. The control electrode of the second transistor may have a different width/length ratio than a width/length ratio of the control electrode of the fourth transistor. The brown-out detection signal may be provided to the processor. The characteristic of the pull-up transistor may be a threshold voltage of the pull-up transistor, and the characteristic of the pull-down transistor may be a threshold voltage of the pull-down transistor.

In yet another aspect, there is provided, a data processing system comprising: a processor; a static random access memory (SRAM) coupled to the processor; and a brown-out detection circuit comprising: a first resistive element having a first terminal coupled to a first power supply voltage terminal, and a second terminal; a P-channel transistor having a source coupled to the second terminal of the first resistive element, a gate coupled to a second power supply voltage terminal, and a drain, wherein the P-channel transistor is for modeling a threshold voltage of a pull-up transistor of a memory cell of the SRAM; an N-channel transistor having a drain coupled to the drain of the P-channel transistor, a gate coupled to the first power supply voltage terminal, and a source coupled to a second power supply voltage terminal, wherein the N-channel transistor is for modeling a threshold voltage of a pull-down transistor of the memory cell; and a comparator having a first input terminal coupled to the first terminal of the first resistive element, a second input terminal coupled to the second terminal of the first resistive element, and an output terminal for providing a brown-out detection signal. The brown-out detection circuit may further comprise a second resistive element coupled between the P-channel transistor and the N-channel transistor. The brown-out detection circuit may further comprise a second resistive element coupled between the source of the N-channel transistor and the second power supply voltage terminal. The brown-out detection signal may be provided to the processor.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

FIG. 1 illustrates, in block diagram form, data processing system 10 in accordance with an embodiment. Data processing system 10 is a simplified data processing system and includes processor 12, memory 14, and brown-out detection circuit 16. In other embodiments, data processing system 10 may include other functional blocks and additional memory. In one embodiment, data processing system 10 may be implemented on an integrated circuit as a system-on-a-chip (SoC). Also, data processing system 10 may be integrated using a conventional complementary metal-oxide semiconductor (CMOS) manufacturing process, or other manufacturing process. Processor 12 is any kind of data processor, such as for example, a microprocessor core, a microcontroller, a digital signal processor (DSP), or the like. Processor 12 is coupled to power supply voltage terminals labeled "$V_{DD1}$" and "$V_{SS}$" for receiving a power supply voltage. Processor 12 includes register 18. Register 18 is a conventional register for storing one or more bits of information. Processor 12 may have additional registers that are not illustrated in FIG. 1.

Memory 14 is bi-directionally connected to processor 12 by a plurality of conductors. The plurality of conductors may comprise a system bus. In other embodiments, there may be other functional blocks coupled to the bus. Also, memory 14 includes power supply voltage terminals labeled "$V_{DD2}$" and "$V_{SS}$" for receiving a power supply voltage. Memory 14 includes a plurality of memory cells for storing data and/or instructions for use by processor 12. For example, memory 14 may be a cache memory. Alternately, memory 14 may be a register file having a cross-coupled latch. In the illustrated embodiment, memory 14 is a static random access memory (SRAM).

Power supply voltage terminal $V_{DD1}$ is for receiving a first power supply voltage and power supply voltage terminal $V_{DD2}$ is for receiving a second power supply voltage. The power supply voltages may be the same or different. In one embodiment, $V_{DD1}$ and $V_{DD2}$ may receive a positive one (1) volt while power supply voltage terminal $V_{SS}$ is coupled to ground (zero volts). Also, the power supply voltages may be independently controlled. For example, data processing system 10 may have a low power, or stand-by, mode operating mode for reducing power consumption during times when processor 12 is not processing data. During the low power mode, the power supply voltage ($V_{DD1}$) is removed from processor 12 while maintaining the power supply voltage ($V_{DD2}$) to memory 14 to retain the data stored in memory 14 for use by processor 12 when the power supply voltage ($V_{DD1}$) is restored. For example, in one embodiment, both $V_{DD1}$ and $V_{DD2}$ receive a power supply voltage of positive 1.0 volt during a normal operating mode. During low power mode, the power supply voltage at $V_{DD1}$ is reduced to zero volts while $V_{DD2}$ is maintained at 1 volt. In another embodiment, during the low power mode, the power supply voltage ($V_{DD2}$) is reduced to a minimum data retention voltage of memory 14, such as for example 0.5 volts, to further reduce power consumption. Also, during the low power mode, a voltage level of power supply voltage terminal $V_{SS}$ that is coupled to memory 14 may be slightly increased above ground to even further reduce power consumption.

Brown-out detection circuit 16 is coupled to power supply voltage terminals $V_{DD2}$ and $V_{SS}$ and is for monitoring the power supply voltage provided to memory 14. Brown-out detection circuit 16 is coupled to provide a brown-out detection signal labeled "BO_DET" to register 18 of processor 12. If the power supply voltage provided to memory 14 drops below a predetermined minimum voltage, such as 0.5 volts, brown-out detection signal BO_DET is asserted to inform processor 12 that the power supply voltage may have dropped below the specified minimum data retention voltage of memory 14. For example, the minimum data retention voltage for memory 14 may be 0.5 volts. To accurately detect the voltage level of power supply voltage $V_{DD2}$, brown-out detection circuit 16 includes transistors that model, or mimic, the transistors of the memory cells. That is, brown-out detection circuit 16 includes a reference circuit having transistors that are substantially the same as, or similar to in some respects, transistors of a memory cell of memory 14. In one embodiment, transistors of the reference circuit model the threshold voltages of the pull-up and pull-down transistors of the memory cells. Therefore, brown-out detection circuit 16 will track process and temperature variations of the memory cells and allow for a lower detection margin than prior art brown-out detection circuits. One example embodiment of a brown-out detection circuit will be further described below.

Figure 2:
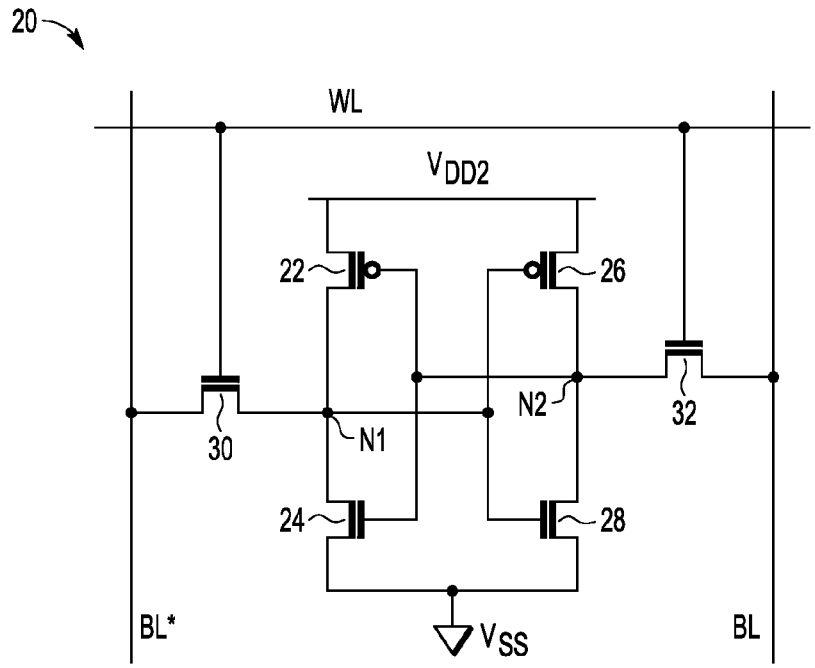
FIG. 2 illustrates, in schematic diagram form, an SRAM cell of the memory of FIG. 1.

FIG. 2 illustrates, in schematic diagram form, a representative SRAM cell 20 of memory 14 of FIG. 1. SRAM cell 20 is one of a plurality of SRAM cells in memory 14. Memory 14 is a conventional SRAM having an array of memory cells organized in rows and columns. A row of memory cells includes a word line and all of the memory cells coupled to the word line. A column of memory cells includes a bit line, or a bit line pair, and all of the memory cells coupled to the bit line or bit line pair. SRAM cell 20 is coupled to a word line labeled "WL" and a bit line pair labeled "BL" and "BL*", where a logic state on bit line BL* is a logical complement of a logic state on bit line BL. SRAM cell 20 is a conventional six-transistor SRAM cell and comprises a cross-coupled latch comprising pull-up P-channel transistors 22 and 26 and pull-down N-channel transistors 24 and 28. P-channel transistor 22 has a first current electrode (source) connected to power supply voltage terminal $V_{DD2}$, a control electrode (gate) connected to storage node N2, and a second current electrode (drain) connected to storage node N1. N-channel transistor 24 has a first current electrode (drain) connected to storage node N1, a control electrode (gate) connected to storage node N2, and a second current electrode connected to power supply voltage terminal $V_{SS}$. P-channel transistor 26 has a source connected to $V_{DD2}$, a gate connected to storage node N1, and a drain connected to storage node N2. N-channel transistor 28 has a drain connected to storage node N2, a gate connected to storage node N1, and a source connected to the $V_{SS}$. Note that circuitry required to select and access SRAM cell 20 is not illustrated.

SRAM cell 20 also includes N-channel access transistors 30 and 32. N-channel transistor 30 has a first source/drain terminal connected to bit line BL*, a gate connected to word line WL, and a second source/drain terminal connected to storage node N1. N-channel transistor 32 has a first source/drain terminal connected to storage node N2, a gate connected to word line WL, and a second source/drain terminal connected to bit line BL.

In general, an SRAM cell is bi-stable and stores a logic state as a differential voltage on the two storage nodes N1 and N2. That is, when storage node N1 is storing a logic low, storage node N2 is storing a logic high, and vice-versa. For example, if storage node N1 is low and storage node N2 is high, then pull-up transistor 22 is off and pull-down transistor is on, thus pulling down node N1 to about $V_{SS}$. Likewise, pull-up transistor 26 is on and pull-down transistor 28 is off, causing node N2 to be pulled up to about $V_{DD2}$. The relative drive strengths of the transistors as well as their threshold voltages determine how difficult it is to cause SRAM cell 20 to change logic states. To reliably maintain the stored logic state, the power supply voltage at $V_{DD2}$ must be above a minimum data retention voltage so that power supply fluctuations do not cause the stored logic state to inadvertently change. Process variations and temperature are among the various factors that can affect the minimum data retention voltage of an SRAM cell. If the power supply voltage drops below the minimum data retention voltage, differences in drive strength and threshold voltage ($V_T$) can cause the logic state to "flip", or change logic states. Generally, normal operating voltages are well above the minimum data retention voltage. However, if the power supply voltage is lowered to reduce power consumption, the stored logic state of the SRAM cell is more susceptible to being changed. A brown-out detection circuit is used to warn a system that uses the SRAM that the data may be corrupted because the power supply voltage dropped below, or close to, a minimum safe voltage level. The accuracy of the brown-out detection circuit affects how low the power supply voltage can be reduced during low power mode.

Figure 3:
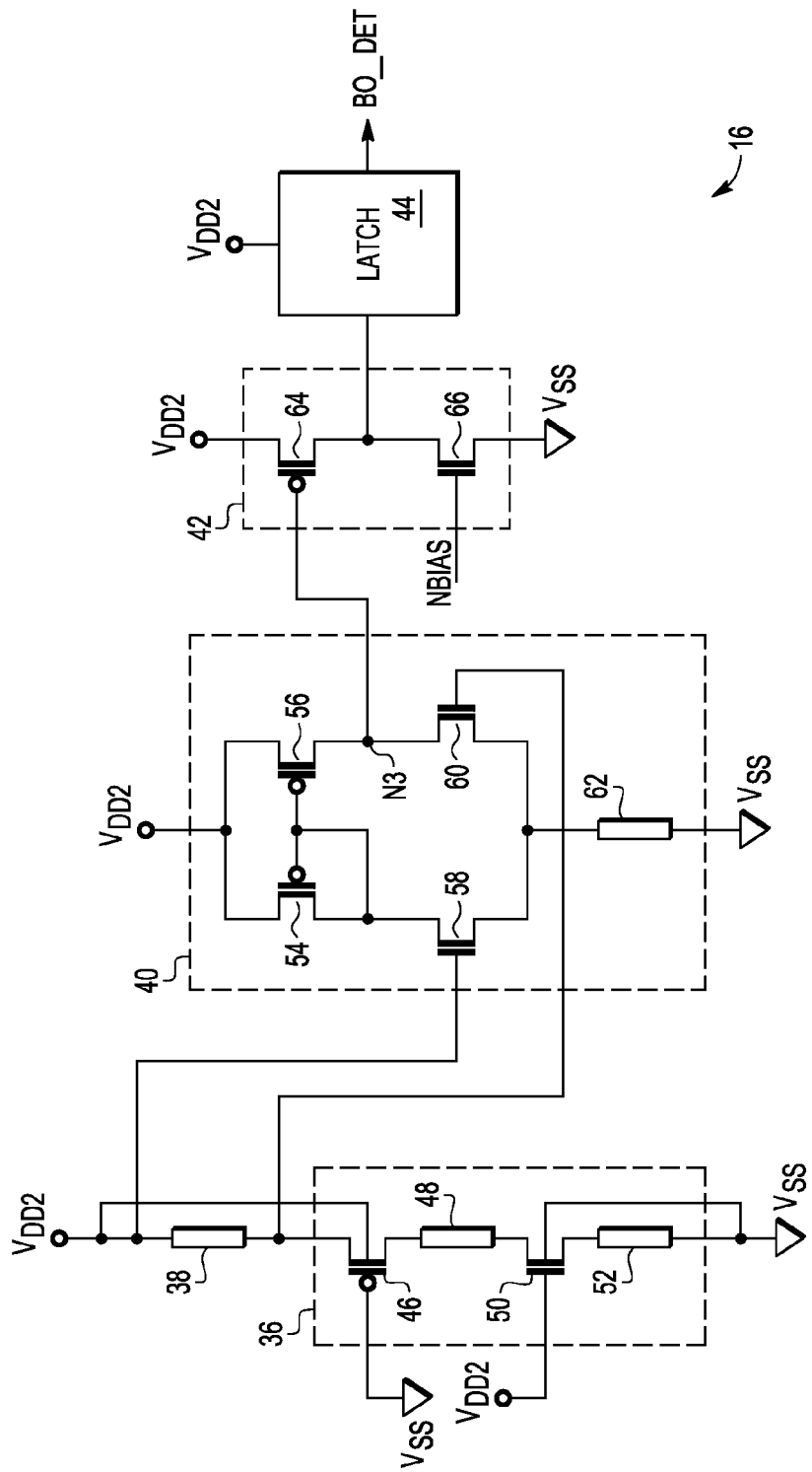
FIG. 3 illustrates, in partial schematic diagram form and partial block diagram form, the brown-out detection circuit of the data processing system of FIG. 1 in more detail.

FIG. 3 illustrates, in partial schematic diagram form and partial block diagram form, brown-out detection circuit 16 of the data processing system 10 in accordance with an embodiment. Brown-out detection circuit 16 includes reference circuit 36, resistor 38, comparator 40, driver circuit 42, and latch 44. Resistor 38 has a first terminal connected to power supply voltage terminal $V_{DD2}$, and a second terminal. In the illustrated embodiment, resistor 38 is implemented as a conventional polysilicon resistor. In other embodiments, resistor 38 can be another type of passive or active resistive element.

Reference circuit 36 includes P-channel transistor 46, resistor 48, N-channel transistor 50, and resistor 52. P-channel transistor 46 has a first current electrode (source) connected to the second terminal of resistor 38, a control electrode (gate) connected to $V_{SS}$, a second current electrode (drain), and a body terminal connected to $V_{DD2}$. Resistor 48 has a first terminal connected to the drain of P-channel transistor 46, and a second terminal. N-channel transistor 50 has a first current electrode (drain) connected to the second terminal of resistor 48, a control electrode (gate) connected to $V_{DD2}$, a second current electrode (source), and a body terminal connected to $V_{SS}$. Resistor 52 has a first terminal connected to the second current electrode of transistor 50, and a second terminal connected to $V_{SS}$. Resistors 48 and 52 are also conventional polysilicon resistors but could be another type of active or passive resistive device.

Typically, transistors designed for use in analog and logic circuits are formed differently than transistors used in an SRAM cell and have different characteristics, even when the SRAM and logic or analog circuits are part of the same integrated circuit. P-channel transistor 46 is provided in reference circuit 36 to model one or more characteristics of an SRAM cell P-channel pull-up transistor, such as P-channel transistors 22 and 26 in FIG. 2. In one embodiment, P-channel transistor 46 is formed as part of an SRAM array, so that P-channel transistor 46 is substantially the same as a pull-up transistor in the array. In another embodiment, P-channel transistor may be implemented outside of the SRAM array, but may be implemented to model a predetermined characteristic of an SRAM cell pull-up transistor. For example, P-channel transistor 46 may be implemented to have the same or substantially similar P-channel $V_T$ as the SRAM cell pull-up transistor, and may be different in other respects. Likewise, N-channel transistor 50 is provided in reference circuit 36 to model one or more characteristics of an SRAM cell N-channel pull-down transistor, such as N-channel transistors 24 and 28 of FIG. 2. N-channel transistor 50 may be formed as part of the SRAM array, so that N-channel transistor 50 is substantially the same as a pull-down transistor in the array. In another embodiment, N-channel transistor 50 may be implemented outside of the SRAM array, but may be implemented to model a predetermined characteristic of an SRAM cell pull-down transistor. For example, N-channel transistor 50 may be formed to have the same or substantially similar N-channel $V_T$ as the SRAM cell pull-down transistor, and may be different in other respects.

Comparator 40 includes P-channel transistors 54 and 56, N-channel transistors 58 and 60, and resistor 62. P-channel transistor 54 has a first current electrode (source) connected to $V_{DD2}$, a control electrode (gate) and second current electrode (drain) connected together. P-channel transistor 56 has a source connected to $V_{DD2}$, a gate connected to the gate and drain of P-channel transistor 54, and a drain connected to an output node labeled "N3". During operation, output node N3 provides a brown-out detection signal in response to sensing a power supply voltage below a predetermined minimum voltage. N-channel transistor 58 has a drain connected to the drain of P-channel transistor 54, a gate connected to the first terminal of resistor 38, and a source. N-channel transistor 60 has a drain connected to the drain of P-channel transistor 56, a gate connected to the second terminal of resistor 38, and a source connected to the source of N-channel transistor 58. Resistor 62 has a first terminal connected to the sources of N-channel transistors 58 and 60, and a second terminal connected to $V_{SS}$. Resistor 62 may be implemented as a polysilicon resistor or other type of active or passive resistive element. In one embodiment, comparator 40 is designed to have an offset. That is, transistor 60 is constructed to have a greater width-to-length ratio (W/L) than the width-to-length ratio of transistor 58.

Driver circuit 42 includes P-channel transistor 64 and N-channel transistor 66. P-channel transistor 64 has a source connected to $V_{DD2}$, a gate connected to the drain of P-channel transistor 56, and a drain. N-channel transistor 66 has a drain connected to the drain of P-channel transistor 64, a gate for receiving a bias voltage labeled "$N_{BIAS}$", and a source connected to $V_{SS}$. Driver circuit 42 amplifies the brown-out detection signal provided at node N3.

Latch 44 is a conventional latch for storing a logic state of the output of driver circuit 42. Latch 44 has an input connected to the drain of P-channel transistor 64, and an output for providing brown-out detection signal BO_DET.

To accurately detect a low power supply voltage, brown-out detection circuit 16 includes a reference cell 36 having transistors 46 and 50 to model the $V_T$ of pull-up and pull-down transistors, respectively, of an SRAM cell. In operation, when power supply voltage $V_{DD2}$ is at a normal operating voltage, each of transistors 46 and 50 are conductive because a gate-source voltage ($V_{GS}$) of each of transistors 46 and 50 is higher than the $V_T$. A current flows through devices 38, 46, 48, 50, and 52. Resistor 38 is provided as a current sensing resistor. A voltage drop across resistor 38 is provided to the inputs of comparator 40 so that transistor 60 is substantially non-conductive and transistor 58 is conductive. The voltage at node N3 is pulled up to about $V_{DD2}$. Transistor 64 is substantially non-conductive and N-channel 66 pulls the input of latch 44 low and brown-out detection signal BO_DET is negated as a logic low.

When power supply voltage $V_{DD2}$ decreases, one or both of transistors 46 and 50 will become non-conductive when the gate-source voltage ($V_{GS}$) of one or both of transistors 46 and 50 decreases below the threshold voltage of transistors 46 and 50. Because the $V_T$ of transistors 46 and 50 is designed to be substantially the same as or similar to the $V_T$ of the SRAM cell transistors, brown-out detection circuit 16 will provide a brown-out detection signal BO_DET very close to the voltage at which SRAM cells of the array will start to fail. When one of both of transistors 46 and 50 become non-conductive, the current flow through devices 38, 46, 48, 50, and 52 is cut off, reducing the voltage drop across resistor 38 so that transistors 58 and 60 receive approximately the same voltage. But because transistor 60 is bigger than transistor 58 (greater W/L), transistor 60 is able to pull down node N3. Transistor 64 becomes conductive, pulling up the input of latch 44. Brown-out detection signal is asserted as a logic high and provided to register 18 of processor 12 (FIG. 1) as described above.

It may be desirable to provide a low voltage warning before the power supply voltage drops below the SRAM cell pull-up and pull-down threshold voltages. Resistor 52 is provided to increase the voltage level that will cause one of both of transistors 46 and 50 to become non-conductive so that the brown-out detection signal is provided before the power supply voltage drops low enough to cause data corruption. In another embodiment, resistor 52 may be omitted from reference circuit 36. Another way to increase the turn-off voltage of transistors 46 and 50 is to increase their threshold voltages by increasing the body terminal voltage level. In the illustrated embodiment, this can be accomplished by changing where the body terminal of transistors 46 and 50 are connected. For example, the $V_T$ of transistor 46 can be changed by connecting the body terminal to the second terminal of resistor 38 instead of the first terminal. Likewise, the $V_T$ of transistor 50 can be changed by connecting the body terminal of transistor 50 to the first terminal of resistor 52.

A current is flowing through reference circuit 36 when the power supply voltage is high enough for transistors 46 and 50 to be conductive. This current flow increases the power consumption of an integrated circuit having brown-out detection circuit 16. To reduce the current flow, resistor 48 is provided as a current limiter. In another embodiment, resistor 48 may not be used.

Although the invention has been described with respect to specific conductivity types or polarity of potentials, skilled artisans appreciate that conductivity types and polarities of potentials may be reversed. For example, in another embodiment, resistor 52 and be used as the sensing resistor for the input of comparator 40 and the conductivity types of the transistors of comparator 40 can be reversed.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of system 10 are circuitry located on a single integrated circuit or within a same device. Alternatively, system 10 may include any number of separate integrated circuits or separate devices interconnected with each other. For example, memory 14 may be located on a same integrated circuit as processor 12 or on a separate integrated circuit or located within another peripheral or slave discretely separate from other elements of system 10.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A data processing system comprising:
   a processor;
   a memory coupled to the processor, the memory comprising a plurality of memory cells, each of the plurality of memory cells coupled to a first power supply voltage terminal and a second power supply voltage terminal, each memory cell having a pull-up transistor and a pull-down transistor coupled to a data storage node; and a brown-out detection circuit comprising:
   a first resistive element having a first terminal coupled to the first power supply voltage terminal, and a second terminal;
   a P-channel transistor having a source coupled to the second terminal of the first resistive element, a gate coupled to the second power supply voltage terminal, and a drain, wherein the P-channel transistor is for modeling a characteristic of the pull-up transistor of a memory cell of the memory;
   an N-channel transistor having a drain coupled to the drain of the P-channel transistor, a gate coupled to the first power supply voltage terminal, and a source coupled to the second power supply voltage terminal, wherein the N-channel transistor is for modeling a characteristic of a pull-down transistor of the memory cell; and
   a comparator having a first input terminal coupled to the first terminal of the first resistive element, a second input terminal coupled to the second terminal of the first resistive element, and an output terminal for providing a brown-out detection signal in response to detecting that a power supply voltage provided to the first and second power supply voltage terminals is below a predetermined voltage.

2. The data processing system of claim 1, wherein the brown-out detection circuit further comprises a second resistive element coupled between the P-channel transistor and the N-channel transistor.

3. The data processing system of claim 1, wherein the brown-out detection circuit further comprises a second resistive element coupled between the source of the N-channel transistor and the second power supply voltage terminal.

4. The data processing system of claim 1, wherein the comparator comprises:
   a first transistor having a first current electrode coupled to the first power supply voltage terminal, and a control electrode and a second current electrode both coupled together;
   a second transistor having a first current electrode coupled to both the control electrode and the second current electrode of the first transistor, a control electrode coupled to the first terminal of the first resistive element, and a second current electrode;
   a third transistor having a first current electrode coupled to the first power supply voltage terminal, a control electrode coupled to the control electrode and second current electrode of the first transistor, and a second current electrode; and
   a fourth transistor having a first current electrode coupled to the second current electrode of the third transistor, a control electrode coupled to the second terminal of the first resistive element, and a second current electrode coupled to the second current electrode of the second transistor.

5. The data processing system of claim 4, wherein the control electrode of the second transistor has a different width/length ratio than a width/length ratio of the control electrode of the fourth transistor.

6. The data processing system of claim 1, wherein the brown-out detection signal is provided to the processor.

7. The data processing system of claim 1, wherein the characteristic of the pull-up transistor is a threshold voltage of the pull-up transistor, and the characteristic of the pull-down transistor is a threshold voltage of the pull-down transistor.

8. A data processing system comprising:
   a processor;
   a static random access memory (SRAM) coupled to the processor; and
   a brown-out detection circuit comprising:
      a first resistive element having a first terminal coupled to a first power supply voltage terminal, and a second terminal;
      a P-channel transistor having a source coupled to the second terminal of the first resistive element, a gate coupled to a second power supply voltage terminal, and a drain, wherein the P-channel transistor is for modeling a threshold voltage of a pull-up transistor of a memory cell of the SRAM;
      an N-channel transistor having a drain coupled to the drain of the P-channel transistor, a gate coupled to the first power supply voltage terminal, and a source coupled to a second power supply voltage terminal, wherein the N-channel transistor is for modeling a threshold voltage of a pull-down transistor of the memory cell; and
      a comparator having a first input terminal coupled to the first terminal of the first resistive element, a second input terminal coupled to the second terminal of the first resistive element, and an output terminal for providing a brown-out detection signal.

9. The data processing system of claim 8, wherein the brown-out detection circuit further comprises a second resistive element coupled between the P-channel transistor and the N-channel transistor.

10. The data processing system of claim 8, wherein the brown-out detection circuit further comprises a second resistive element coupled between the source of the N-channel transistor and the second power supply voltage terminal.

11. The data processing system of claim 8, wherein the brown-out detection signal is provided to the processor.

* * * * *